US012676598B2

(12) United States Patent
Garcia et al.

(10) Patent No.: US 12,676,598 B2
(45) Date of Patent: *Jul. 7, 2026

(54) TRANSVERSELY-EXCITED FILM BULK ACOUSTIC RESONATORS WITH NARROW GAPS BETWEEN BUSBARS AND ENDS OF INTERDIGITAL TRANSDUCER FINGERS

(71) Applicant: Murata Manufacturing Co., Ltd., Nagaokakyo (JP)

(72) Inventors: Bryant Garcia, Belmont, CA (US); Filip Iliev, San Francisco, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 631 days.

This patent is subject to a terminal disclaimer.

(21) Appl. No.: 17/961,231

(22) Filed: Oct. 6, 2022

(65) Prior Publication Data
US 2023/0022403 A1    Jan. 26, 2023

Related U.S. Application Data

(63) Continuation of application No. 17/393,111, filed on Aug. 3, 2021, now Pat. No. 12,308,825.
(Continued)

(51) Int. Cl.
*H03H 9/54* (2006.01)
*H03H 3/02* (2006.01)
(Continued)

(52) U.S. Cl.
CPC ................ *H03H 9/54* (2013.01); *H03H 3/02* (2013.01); *H03H 9/02015* (2013.01);
(Continued)

(58) Field of Classification Search
CPC .............. H03H 9/02; H03H 9/25; H03H 9/64
See application file for complete search history.

(56) References Cited

U.S. PATENT DOCUMENTS

| | | | |
|---|---|---|---|
| 5,705,399 A | 1/1998 | Larue | |
| 5,853,601 A | 12/1998 | Krishaswamy et al. | |
| | (Continued) | | |

FOREIGN PATENT DOCUMENTS

| | | | |
|---|---|---|---|
| WO | 2016017104 | 2/2016 | |
| WO | 2018003273 A1 | 1/2018 | |

OTHER PUBLICATIONS

T. Takal, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Andrea Lindgren Baltzell
*Assistant Examiner* — Alan Wong
(74) *Attorney, Agent, or Firm* — ArentFox Schiff LLP

(57) ABSTRACT

An acoustic resonator has a piezoelectric plate attached to the surface of the substrate except for a portion of the piezoelectric plate forming a diaphragm spanning a cavity in the substrate. An interdigital transducer (IDT) formed on the plate has interleaved fingers on the diaphragm with first parallel fingers extending from a first busbar and second parallel fingers extending from a second busbar of the IDT. An average center-to-center distance between adjacent interleaved fingers defines an IDT pitch. The IDT has a gap distance between the ends of the first plurality of parallel fingers and the second busbar, and between the ends of the second plurality of parallel fingers and the first busbar; and the gap distance is less than $\frac{2}{3}$ times the IDT pitch.

19 Claims, 11 Drawing Sheets

Related U.S. Application Data

(60) Provisional application No. 63/148,803, filed on Feb. 12, 2021.

(51) Int. Cl.
*H03H 9/02* (2006.01)
*H03H 9/205* (2006.01)

(52) U.S. Cl.
CPC .... *H03H 9/02157* (2013.01); *H03H 9/02228* (2013.01); *H03H 9/205* (2013.01); *H03H 2003/021* (2013.01)

(56) References Cited

U.S. PATENT DOCUMENTS

| | | | |
|---|---|---|---|
| 6,540,827 B1 | 4/2003 | Levy et al. | |
| 6,707,229 B1 | 3/2004 | Martin | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,278,802 B1 | 10/2012 | Lee et al. | |
| 8,344,815 B2 | 1/2013 | Yamanaka | |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,526,398 B2 | 12/2016 | Olsson | |
| 9,748,923 B2 | 8/2017 | Kando et al. | |
| 9,780,759 B2 | 10/2017 | Kimura et al. | |
| 10,200,013 B2 | 2/2019 | Bower et al. | |
| 10,270,425 B2 * | 4/2019 | Iwaki | H03H 9/14535 |
| 10,491,192 B1 * | 11/2019 | Plesski | H03H 9/02228 |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 | 11/2020 | Plesski et al. | |
| 11,588,469 B2 | 2/2023 | Daimon | |
| 11,722,122 B2 * | 8/2023 | Goto | H03H 9/02842 333/193 |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0261250 A1 | 12/2004 | Kadota et al. | |
| 2006/0125489 A1 | 6/2006 | Feucht et al. | |
| 2006/0222568 A1 | 10/2006 | Wang et al. | |
| 2007/0194863 A1 | 8/2007 | Shibata et al. | |
| 2010/0064492 A1 | 3/2010 | Tanaka | |
| 2010/0123367 A1 | 5/2010 | Tai et al. | |
| 2011/0109196 A1 | 5/2011 | Goto | |
| 2011/0278993 A1 | 11/2011 | Iwamoto | |
| 2013/0015353 A1 | 1/2013 | Tai et al. | |
| 2013/0234805 A1 | 9/2013 | Takahashi | |
| 2013/0321100 A1 | 12/2013 | Wang | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2017/0370791 A1 | 12/2017 | Nakamura et al. | |
| 2018/0123016 A1 | 5/2018 | Gong et al. | |
| 2018/0191322 A1 | 7/2018 | Chang et al. | |
| 2019/0068164 A1 | 2/2019 | Houlden et al. | |
| 2019/0123713 A1 * | 4/2019 | Daimon | H03H 9/1457 |
| 2019/0131953 A1 | 5/2019 | Gong | |
| 2019/0273480 A1 | 9/2019 | Lin | |

OTHER PUBLICATIONS

R. Olsson III, K. Hattar et al. "A high electromechanical coupling coefficient SHO Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM Of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y—cut X—propagation LiNbO3 plates." Electron. Comm. Jpn. Pt. 1, 69, No. 4 (1986): 47-55. doi:10.1002/ecja.4410690406.

Naumenko et al., "Optimal orientations of Lithium Niobate for resonator SAW filters", 2003 IEEE Ultrasonics SYMPOSIUM-pp. 2110-2113. (Year: 2003).

Webster Dictionary "Meaning of "diaphragm" Merriam Webster since 1828.

Safari et al. "Piezoelectric for Transducer Applications" published by Elsevier Science Ltd., p. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LINDO3 Film Bulk Acoustic Resonator, " 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001.10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

(56) References Cited

OTHER PUBLICATIONS

Durmus et al. "Acoustic-Based Biosensors" Encyclopedia of Microfluidics and Nanofluidics. DOI 10.1007/978-3-642-27758-0_10-2 Springer Science+Business Media New York 2014.

* cited by examiner

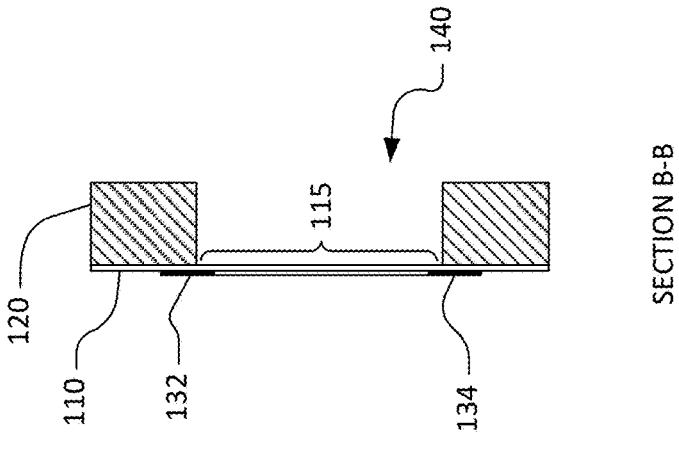
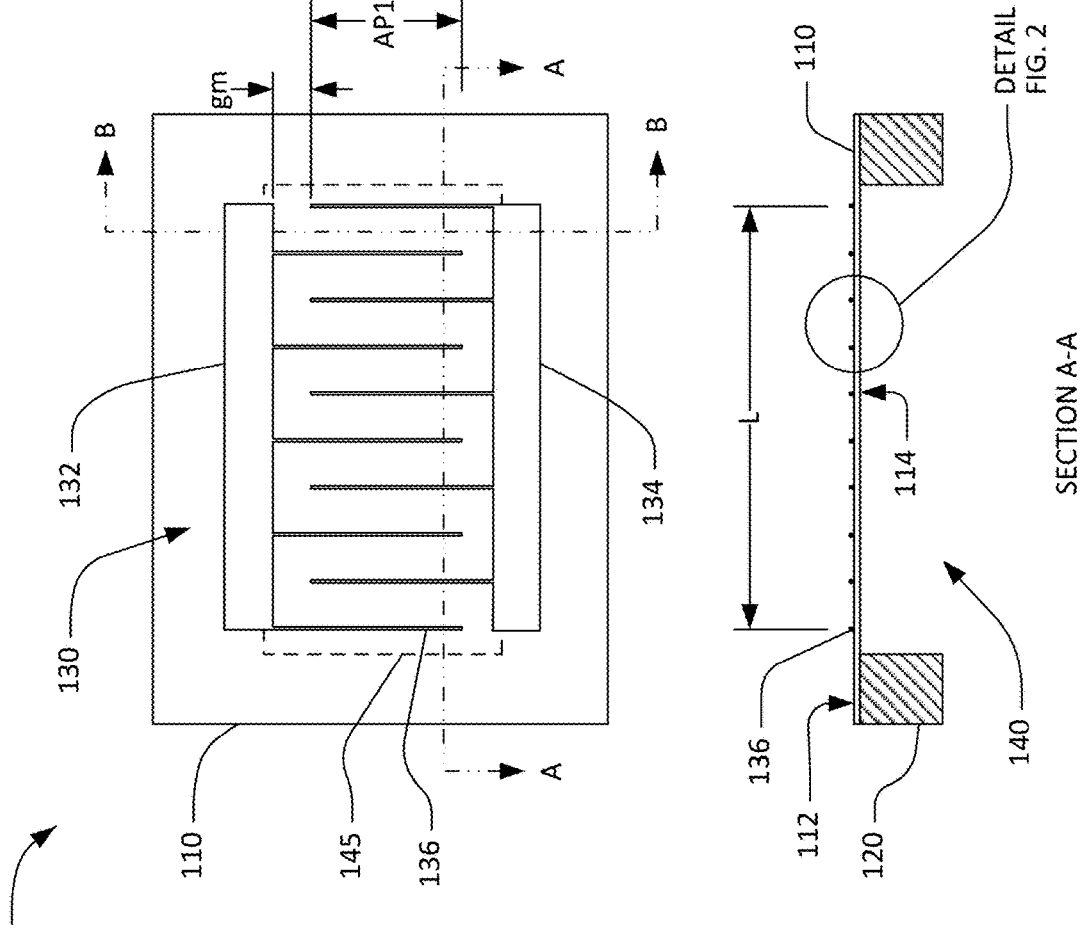
SECTION B-B
SECTION A-A
DETAIL C
FIG. 2
FIG. 1

DETAIL C

SECTION A-A

450

Frequency, GHz

460

Conductance, dB

480

Note: only one of actions 610A, 610B, 610C is performed in each of three variations of the process 600.

TRANSVERSELY-EXCITED FILM BULK ACOUSTIC RESONATORS WITH NARROW GAPS BETWEEN BUSBARS AND ENDS OF INTERDIGITAL TRANSDUCER FINGERS

RELATED APPLICATION INFORMATION

This patent application is a continuation-in-part of U.S. patent application Ser. No. 17/393,111, filed Aug. 3, 2021, entitled TRANSVERSELY-EXCITED FILM BULK ACOUSTIC RESONATORS WITH NARROW GAPS BETWEEN BUSBARS AND ENDS OF INTERDIGITAL TRANSDUCER FINGERS, which claims priority to U.S. Provisional Patent Application No. 63/148,803, filed Feb. 12, 2021, entitled NARROW BUSBAR-ELECTRODE GAP XBAR. All of these applications are incorporated herein by reference.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost.

Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of or having a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIG. 1 includes a schematic plan view and two schematic cross-sectional views of a transversely-excited film bulk acoustic resonator (XBAR).

Figure 2:
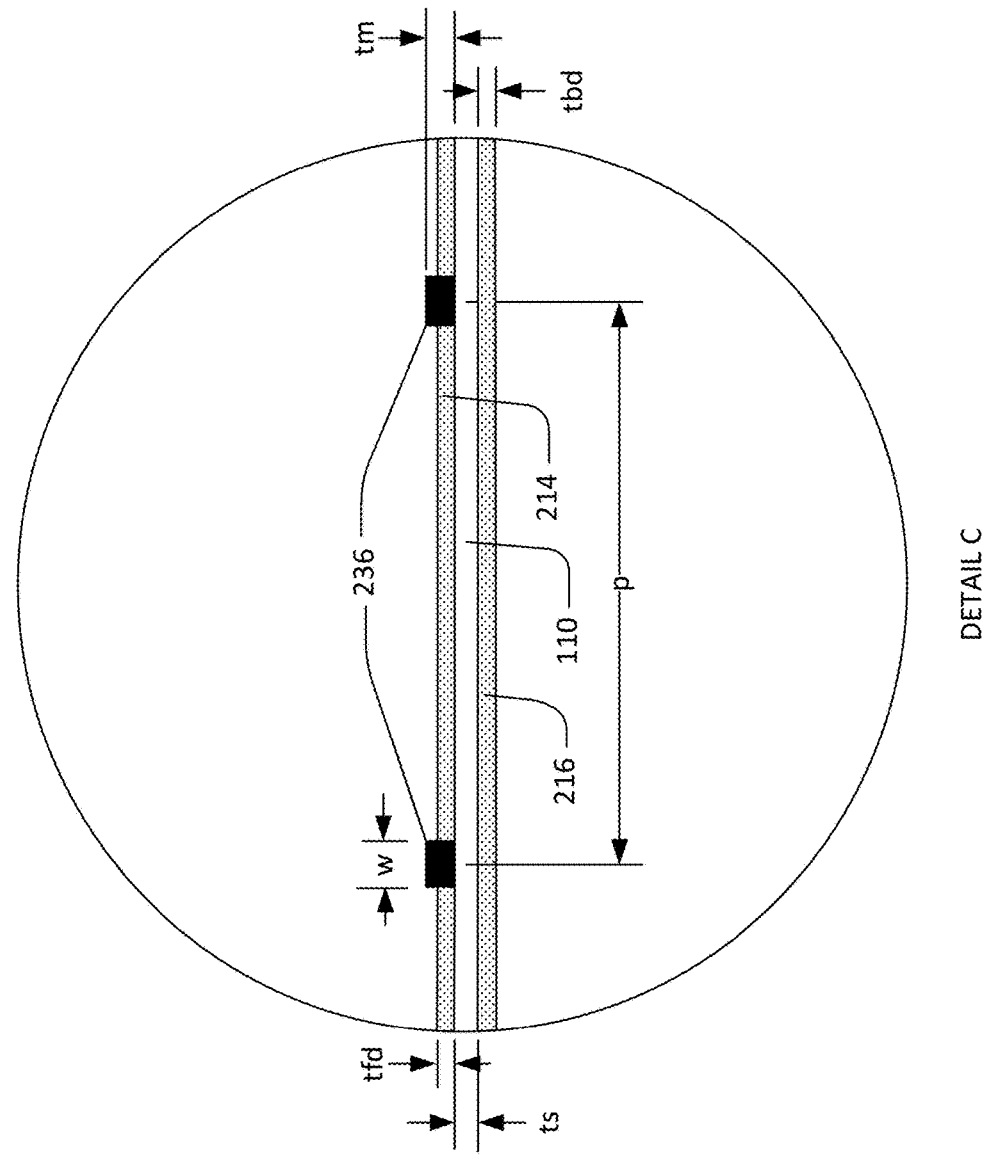
FIG. 2 is an expanded schematic cross-sectional view of a portion of the XBAR of FIG. 1.
Figure 2:

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Transversely-Excited Film Bulk Acoustic Resonator (XBAR) is a new resonator structure for use in microwave filters. The XBAR is described in U.S. Pat. Nos. 10,491,192, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include front-side and/or back-side dielectric layers. An XBAR resonator may be such a diaphragm or membrane with an interdigital transducer (IDT) formed on a diaphragm or membrane.

The dominant parameter that determines the resonance frequency of an XBAR is the thickness of the piezoelectric membrane or diaphragm suspended over a cavity. Resonance frequency also depends, to a lesser extent, on the pitch and width, or mark, of the IDT fingers. Many filter applications require resonators with a range of resonance and/or anti-resonance frequencies beyond the range that can be achieved by varying the pitch of the IDTs.

In XBARs using Y-cut lithium niobate as the piezoelectric material in the piezoelectric plate, spurious modes may be excited in the gap region between the ends of the IDT fingers and the adjacent busbars. Such spurious modes may cause undesired spurs in the admittance of an XBAR. These spurious modes are suppressed or eliminated when the gap distance between the ends of the IDT fingers and the adjacent/opposing busbars is reduced to a fraction of the IDT finger pitch.

The following describes improved XBAR resonators, filters and fabrication techniques for XBAR resonators with narrow gaps between busbars and ends of interdigital transducer (IDT) fingers. In some cases, the gap distance between the ends of the IDT fingers and the adjacent IDT busbars may be less than $2/3$ times the IDT finger pitch. In addition, or independently, the gap distance between the ends of the IDT fingers and the adjacent IDT busbars may be between $2/3$ and $1/2$ of the IDT finger pitch of interleaved fingers of the IDT.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In some examples, the piezoelectric plates may be Z-cut, which is to say the Z axis is normal to the surfaces. In other examples, the piezoelectric plates may be rotated Y-cut, such as described in U.S. Pat. No. 10,790,802, issued Sep. 29, 2020 and titled TRANSVERSELY EXCITED FILM BULK ACOUSTIC RESONATOR USING ROTATED Y-X CUT LITHIUM NIOBATE, incorporated herein by reference. In some cases, the piezoelectric plates may be Y-cut, having Euler angles of 0,B,0 with 0<B<70 such as described in U.S. patent application Ser. No. 17/122,977, filed 112/15/2020 and titled ACOUSTIC RESONATORS AND FILTERS WITH REDUCED TEMPERATURE COEFFICIENT OF FREQUENCY, incorporated herein by reference. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate may be attached directly to the substrate, or may be attached to the substrate via one or more intermediate material layers.

As shown in FIG. 1, the diaphragm 115 is contiguous with the rest of the piezoelectric plate 110 around all of a perimeter 145 of the cavity 140. In this context, "contiguous" means "continuously connected without any intervening item".

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The distance gm between the ends of the IDT fingers and the adjacent IDT busbars (e.g., busbar for the opposing fingers of interleaved fingers) may be between 5 and 10 micrometers (um). In some cases, it is 5 um. The adjacent IDT busbars are busbar for the opposing fingers of the interleaved fingers. The adjacent busbars may have opposite electrical polarity (e.g., plus v minus); or be signal inputs and outputs during XBAR filter use.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP1 and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness is of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of multiple oxide and/or nitride coatings such as SiO2 and Si3N4 material.

The IDT fingers 238 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the "pitch" or center-to-center spacing of adjacent IDT fingers, which may be referred to as the pitch of the IDT and/or the pitch of the XBAR. In some cases, the center-to-center spacing of adjacent IDT fingers may vary along the length of the IDT. In such cases, dimension p is the average of the center-to-center spacings of all pairs of adjacent fingers in the IDT. Dimension w is the width or "mark" of the IDT fingers. In some cases, the width of the IDT fingers may vary along the length of the IDT. In such cases, dimension w is the average width of all IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The pitch p may be between 3 um and 8 um. The pitch p may be between 4 um and 5 um. The plate thickness tm may be between 300 nm and 500 nm. The plate thickness tm may be 400 nm. The finger width w may be between 0.5 um and 7.5 um. The finger width w may be 1 um. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
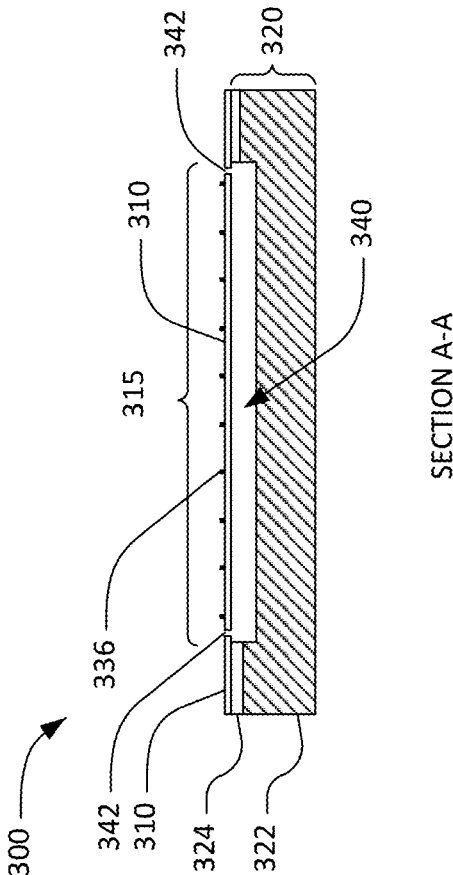
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to a substrate 320. The substrate 320 includes a base 322 and, optionally, one or more intermediary layers 324. The base 322 may be, for example, silicon and the intermediary layer may be silicon dioxide. The base 322 and/or the intermediary layer 324 may be other materials. A portion of the piezoelectric plate 310 forms a diaphragm 315 spanning a cavity 340 in the substrate 320. The cavity 340, does not fully penetrate the substrate 320, and is formed in the substrate under the portion of the piezoelectric plate 310 containing the IDT of an XBAR. The cavity 340 may be within the intermediary layer 324 or may penetrate the intermediary layer 324 and extend into the base 322 as shown. Fingers, such as finger 336, of an IDT are disposed on the diaphragm 315. Plate 310, diaphragm 315 and fingers 336 may be plate 110, diaphragm 115 and fingers 136. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediary material layers 324 may be disposed between plate 310 and base 322. An intermediary layer may be a bonding layer, an etch stop layer, a sealing layer, an adhesive layer or layer of other material that is attached or bonded between plate 310 and base 322. In other embodiments, the piezoelectric plate 310 may be attached directly to the base 322 and an intermediary layer does not exist.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e. down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
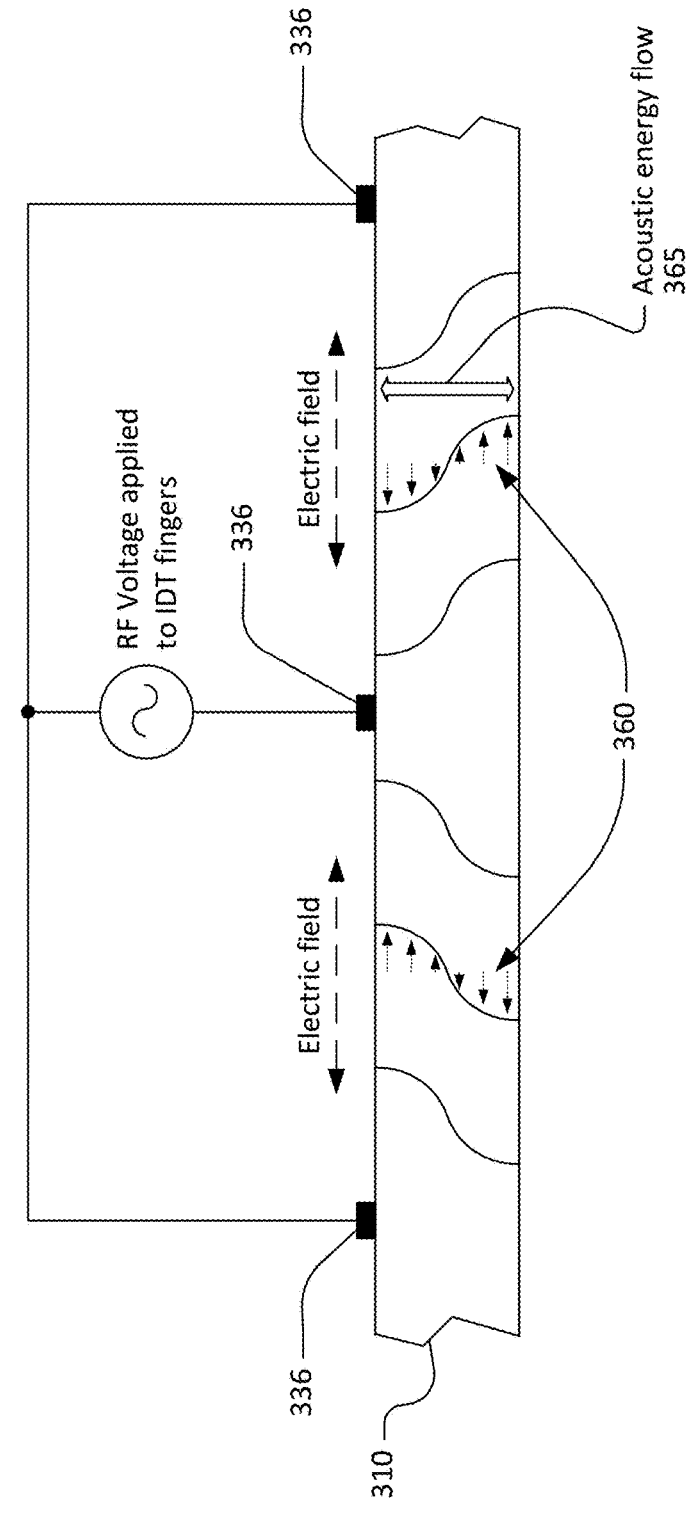
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4A:
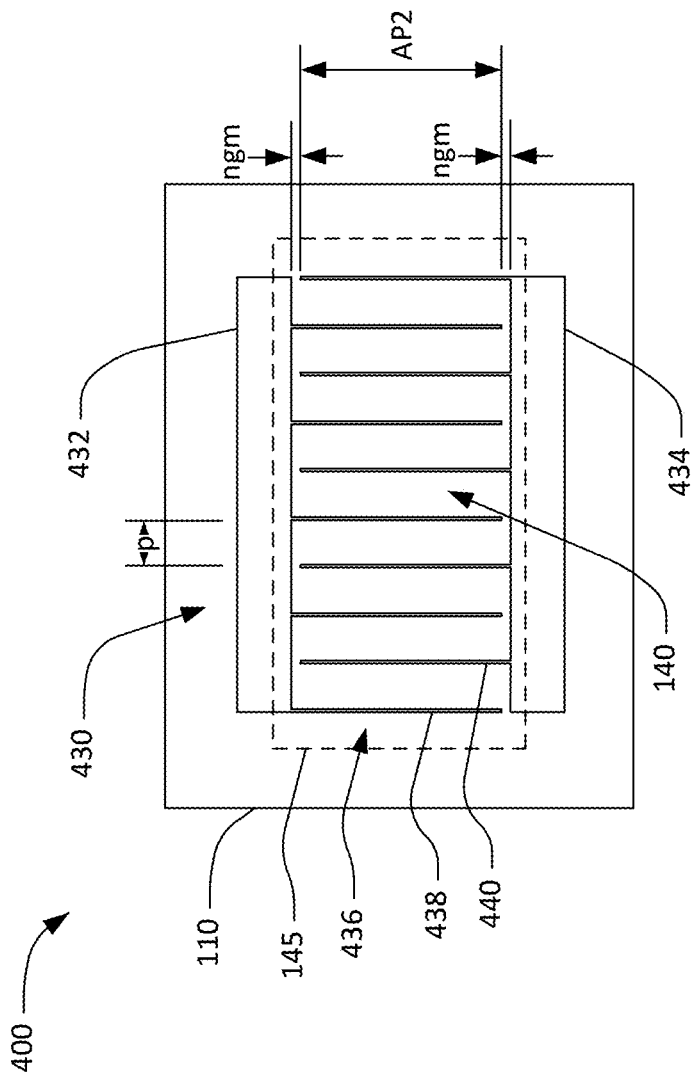
FIG. 4A shows a simplified schematic top view of an XBAR with narrow gaps between busbars and ends of interdigital transducer (IDT) fingers.

FIG. 4A is a schematic cross-sectional view of XBAR device 400 with narrow gaps between busbars 432 and 434 and ends of interdigital transducer (IDT) fingers 436 to reduce spurious modes that are excited in the gap region between the ends of the IDT fingers and the adjacent busbars. Such spurious modes may cause undesired spurs in the admittance of an XBAR. As compared to XBAR 100, these spurious modes are suppressed or eliminated when the gap distance between the ends of the IDT fingers and the opposing busbars is reduced, such as to a fraction of the IDT finger pitch, to below 2 um and/or to 1 um.

Device 400 may represent a version of device 100 but with shorter gaps ngm than gm. Device 400 may be a version of device 300. 4A shows filter device 400 comprising piezoelectric plate 410 having a parallel front and back surface. The back surface of the plate is attached to a top surface of a substrate (not visible but behind the piezoelectric plate 410) except for a portion of the piezoelectric plate 410 forming a diaphragm spanning a cavity in the substrate. The dashed line is the perimeter 145 of the cavity defined by the intersection of the cavity and the surface of the substrate. The portion of the piezoelectric plate 110 within the dashed line is the diaphragm.

The piezoelectric plate has a plate thickness ts (not shown but extending into the page, also see FIG. 2) between piezoelectric plate front and back surfaces. Thickness ts may be a constant thickness. Thickness ts may be a constant thickness where the plate spans the cavity.

An IDT 430 is formed on the surface of the piezoelectric plate facing away from the cavity. The IDT 430 includes a first busbar 432, a second busbar 434, and a plurality of interleaved fingers 436, similar to 136 but with different gap distance ngm instead of gm. The interleaved fingers 436 include a set of parallel fingers 438 attached to and extending from busbar 432 of the IDT; and a set of parallel fingers 440 attached to and extending from busbar 434 of the IDT. The interleaved fingers have an IDT finger pitch p between adjacent ones of the sets 438 and 440 of parallel fingers. Pitch p may be the center-to-center spacing between immediately adjacent ones of the parallel fingers of sets 438 and 440. During use, the adjacent busbar is connected to the opposing signal connection of the signal connection to the busbar attached to fingers having finger ends that form the gap distance with the adjacent busbar.

The interleaved fingers of the IDT are disposed on the diaphragm with an overlapping distance of the interleaved fingers defining an aperture AP2 of the resonator device. Aperture AP2 may be greater in distance than aperture AP1 of FIG. 1A. Fingers 436 span or are over cavity 140. In some cases, part of the busbars of the IDT are also over the cavity. In other cases, all of the busbars are over the substrate but not over the cavity.

The IDT has a gap distance ngm between the ends of the fingers 440 and the adjacent busbar 432, and between the ends of the fingers 438 and the adjacent busbar 434. A distance between the interleaved fingers may define an IDT pitch. The IDT pitch may be a center-to-center spacing between adjacent ones of the first and second plurality of parallel fingers. The gap distance may be less than 2/3 times the IDT pitch. The gap distance ngm may be between 1.0 and 5 um. The gap distance ngm may be between 1/2 and 2/3 times the IDT pitch. The gap distance ngm may be between 2.5 um and 1.0 um; and the IDT pitch is between 3 um and 6.5 um. Distance ngm may be 1 micrometer (um) um and the plate thickness is between 200 nm and 800 nm. Distance ngm may be 1 micrometer (um) um regardless of the plate thickness. The relationship between the ranges of distance ngm and IDT pitch may be linear.

In some cases, the length of fingers 436 is 2-5 um longer than that of fingers 136 to change the gap distance from gm to ngm. In some cases, it is 3-4 um longer in order to change the gap distance.

During use of XBAR 400, a radio frequency signal applied to the IDT excites a primary shear acoustic mode in the piezoelectric plate over the cavity; and wherein a thickness of the piezoelectric plate is selected to tune the primary shear acoustic mode in the piezoelectric plate. The radio frequency signal may be applied to or across the adjacent busbars in series or in parallel. The radio frequency signal may be applied to the adjacent busbars to use the XBAR as a shunt or as a series resonator as noted in FIG. 5.

In some cases, the plate is a Y-cut lithium niobate piezoelectric material and the radio frequency signal applied to the IDT excites spurious modes in a gap region between the ends of the IDT fingers and the adjacent busbars that cause undesired spurs in the admittance of an XBAR 400. In this case, the gap distance ngm can be a predetermined gap distance to suppress the spurious modes by up to 10 or 20 dB at certain frequencies during use. For example, changing gap distance from gm to ngm may cause a reduction in the spurious modes excited in the gap region between the ends of the IDT fingers and the adjacent busbars by up to 10 or 20 dB at certain frequencies during use. The relationship between the reduction in the spurious modes excited in the gap region and the reduction of gap distance from gm to ngm may be linear.

Figure 4B:
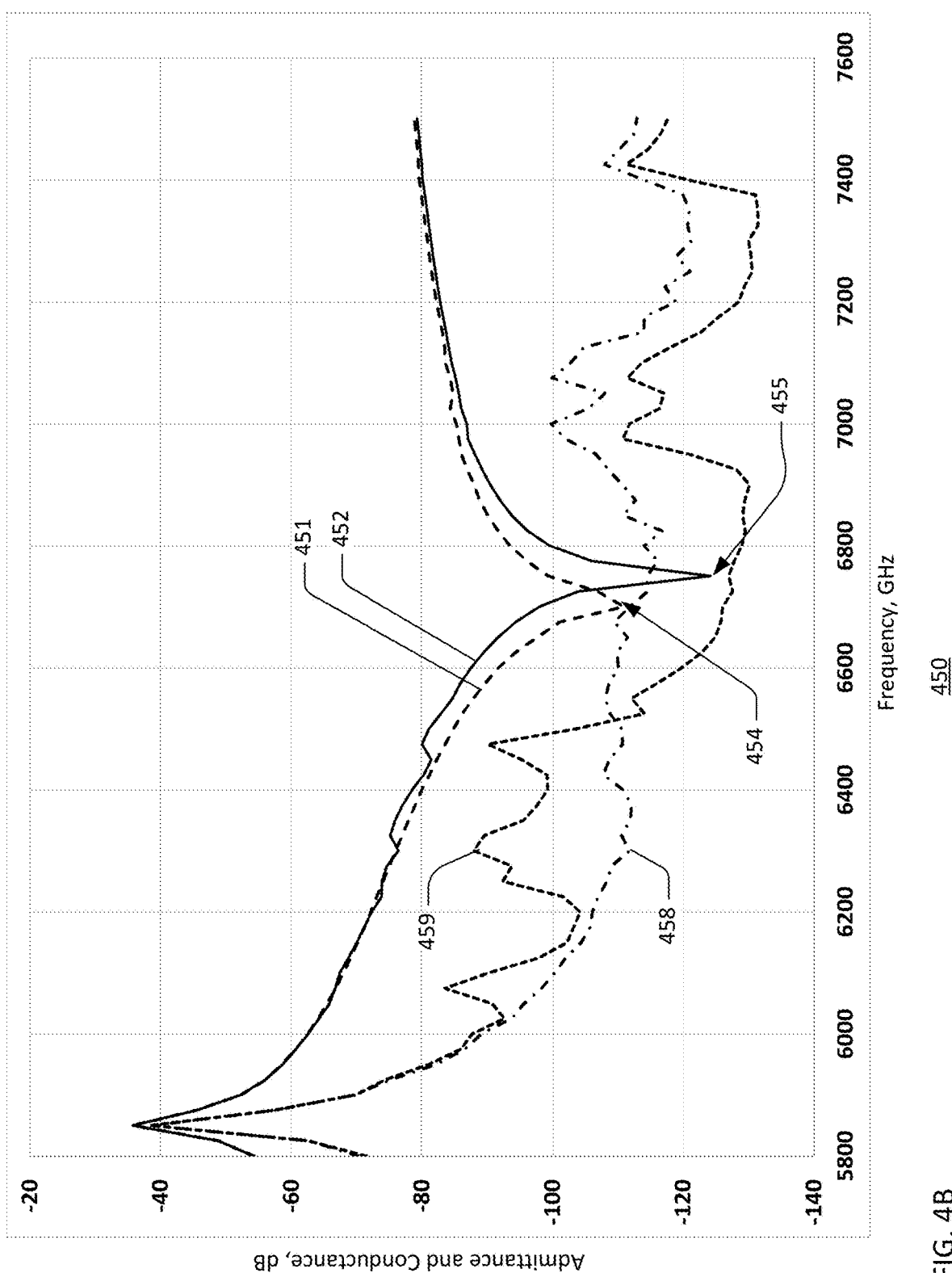
FIG. 4B is a graph that compares the magnitude of admittance and the conductance of XBARs with different gap distances.

For example, FIG. 4B is a graph 450 that compares the magnitude of the admittance and the conductance of XBARs with different gap distances, such as for distances gm or ngm. Admittance is a vector value that can be expressed as a magnitude and a phase. Conductance is the component of admittance that is in-phase with the applied signal. Conductance is a scalar value. Graph 450 shows plots 451 and 452 of the magnitudes of the admittances, and plots 451 and 459 of the conductance (on a logarithmic scale, such as decibel scale—dB) as a function of frequency of the XBARs simulated using finite element method (FEM) simulation techniques. The admittance and conductance data results from three-dimensional simulation of XBARs having a Y-cut lithium niobate and with the following differences in parameters: a) plots 451 and 458 are for a version of XBAR 400 with gap distance ngm of 1 um; and b) plots 452 and 459 are for a version of XBAR 100 with gap distance gm of 5 um. The example plots in FIG. 4B may be for a Y-cut lithium niobate piezoelectric plate having Euler angles of (0, 38, 0) and a plate thickness 276 nm; and an IDT pitch of 3 microns.

Graph 450 shows that admittance performance for plot 452 is less stable, less predictable and suffers more loss at the anti-resonance at the lowest admittance peak 455 as compared to plot 451. Specifically, plot 452 bumps upwards unevenly between 6300 and 6600 MHz due to energy lost to spurious modes in the gaps at the ends of the IDT fingers. This difference in performance makes the version of XBAR 400 for plot 451 more desirable than that of the version of XBAR 100 for plot 452. The frequency shifted peak of the curve at 454 as compared to at 455 at anti-resonance is caused by the extra capacitance between the IDT fingers and the adjacent busbar and may be a negative feature for plot 451 because large coupling (separation between the resonance and anti-resonance peaks) may be desired. However, if this is an adverse feature of the plot 451, it may not be as important as the reduction in energy lost to spurious gap modes by plot 452 at between 6300 and 6600 MHz and by plot 459.

Notably, graph 450 also shows that admittance performance for plot 459 has unwanted spurs in the admittance as compared to plot 458. Specifically, graph 450 shows that admittance performance for plot 459 is has unwanted spurs in the admittance with peaks at 6100, 6300, and 6450 MHz as compared to plot 458. These three peaks may be considered "certain frequencies during use" at which the gap distance ngm can be a predetermined gap distance to suppress the spurious modes by up to 10 or 20 dB. These undesired spurs can be eliminated by reducing the busbar-electrode gap distance, such as from distance gm to ngm. Thus, these reduction or elimination of the spurs make the version of XBAR 400 for plot 458 more desirable than that of the version of XBAR 100 for plot 459.

Figure 4C:
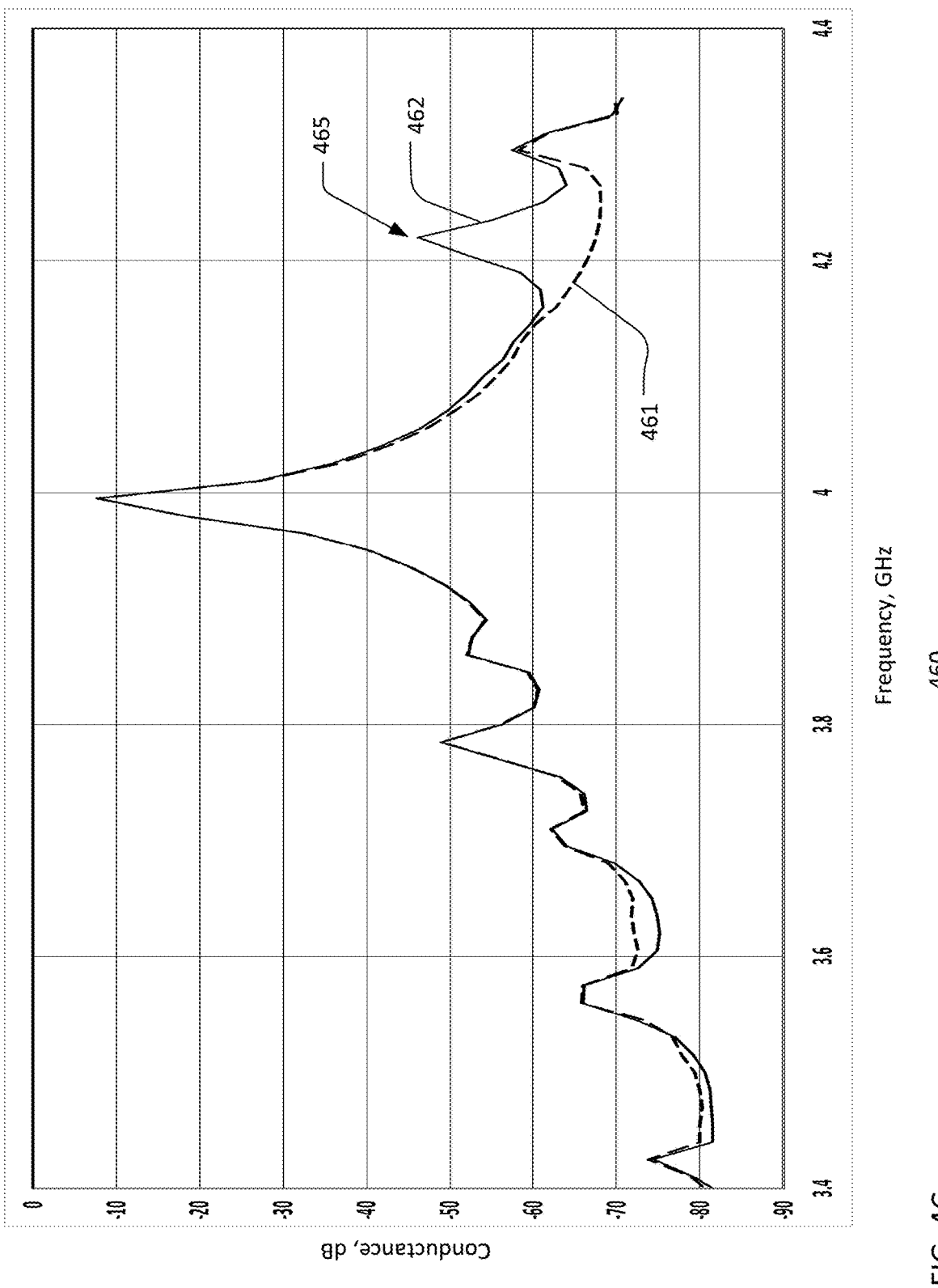
FIG. 4C is a graph that compares the conductance of XBARs with different gap distances.

FIG. 4C is a graph 460 that compares the conductance (real component of admittance) of XBARs with different gap distances, such as for distances gm or ngm. Graph 460 shows plots 461 and 462 of the conductance (on a logarithmic scale, such as decibel scale—dB) as a function of frequency of the XBARs simulated using FEM simulation techniques. The conductance data results from three-dimensional simulation of XBARs having a Y-cut lithium niobate where plot 461 is for a version of XBAR 400 with gap distance ngm of 1 um, and plot 462 is for a version of XBAR 100 with gap distance gm of 5 um. The example plots in FIGS. 4C-D may be for a Y-cut lithium niobate piezoelectric plate having Euler angles of (0, 38, 0) and a plate thickness 562 nm; and an IDT pitch of 6 microns.

Plot 462 shows that the resonator with the 5 um gap of gm has a big spur 465 at about 4.22 GHz. If this is a shunt resonator in a filter, this spur 465 will be at or near the low band edge of the filter and is thus an undesired spur. Plot 461 shows that the spur 465 is removed with a 1 um gap of ngm such as by reducing the busbar-electrode gap distance from distance gm to ngm. The undesired spur 465 is due to energy lost to spurious modes in the gaps at the ends of the IDT fingers and makes the version of XBAR 400 for plot 461 more desirable than that of the version of XBAR 100 for plot 462.

Figure 4D:
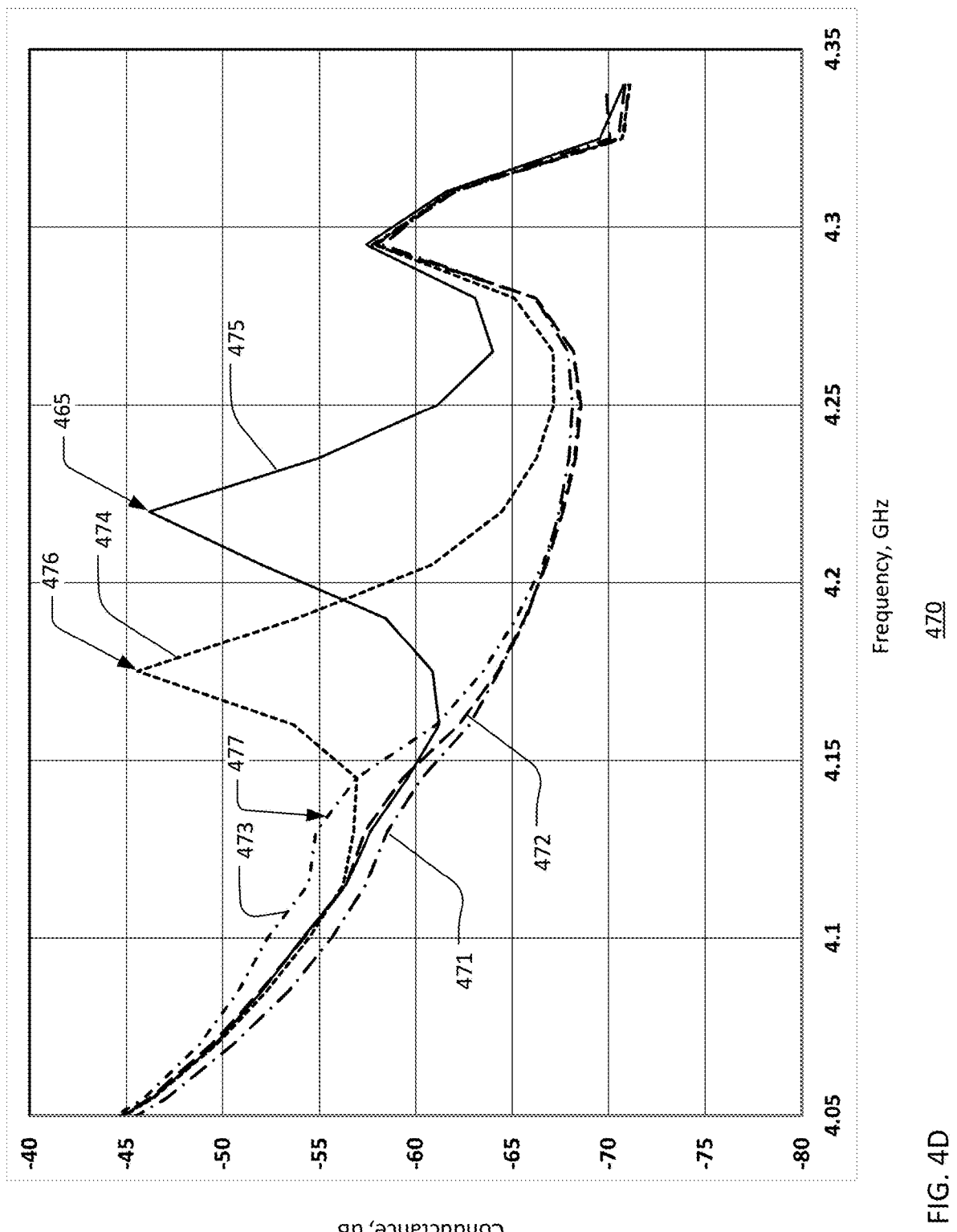
FIG. 4D is another graph that compares the conductance of XBARs with different gap distances.

FIG. 4D is a graph 470 that compares the conductance of XBARs with different gap distances, such as for distances between gm or ngm. Graph 470 shows plots 471, 472, 473 and 474 of the conductance dB as a function of frequency of the XBARs simulated using FEM simulation techniques. The conductance data results from three-dimensional simulation of XBARs having a Y-cut lithium niobate or lithium tantalate piezoelectric plate where plot 471 is part of plot 461; plot 472 is for an XBAR with busbar-electrode gap distance of 2 um; plot 473 is for an XBAR with busbar-electrode gap distance of 2.5 um; plot 474 is for an XBAR with busbar-electrode gap distance of 4 um; and plot 475 is part of plot 462.

Plot 472 shows that the resonator with the 2 um gap eliminates the big spurs 476 and 465 at about 4.175 and 4.22

GHz of plots 474 and 475. If this is a shunt resonator in a filter, these spurs will be right at the low band edge of the filter and are thus undesired spurs. These spurs are removed by reducing the busbar-electrode gap distance from distance from 5 um or 4 um to 2 um. These spurs are due to energy lost to spurious modes in the gaps at the ends of the IDT fingers and makes the versions of XBAR for plots 471 and 472 more desirable than that of the versions of XBAR for plots 474 and 475.

Plot 473 shows that the resonator with the 2.5 um gap has a slight spur 477 at about 4.1 to 4.15 GHz as compared to the big spurs 476 and 465. This spur 477 may be acceptable for a shunt resonator. Thus, reducing the busbar-electrode gap distance from distance from 5 um or 4 um to 2.5 um may make the versions of XBAR for plot 473 more desirable than that of the versions of XBAR for plots 474 and 475.

Figure 4E:
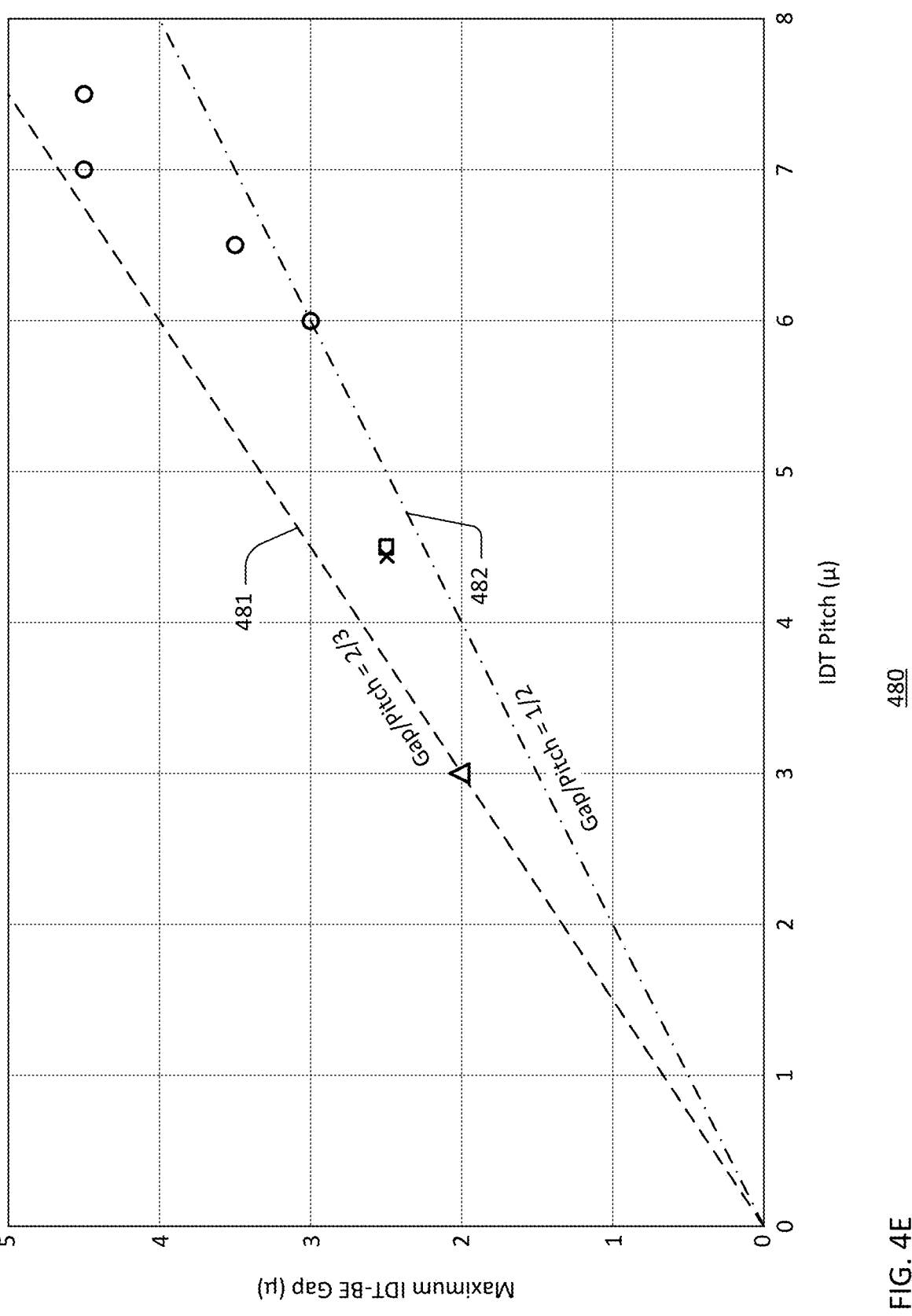
FIG. 4E is a graph that compares the maximum busbar-electrode gap distance to IDT pitch for XBARs.

FIG. 4E is a graph 480 that compares the maximum busbar-electrode gap distance to IDT pitch for XBARs with two different Y-cut angles of the LN plate material and three different LN piezoelectric plate thicknesses. The cut angles may represent angels that span a space that encompasses multiple filter designs. Graph 480 shows triangle, X, square and circle data points of the maximum busbar-electrode gap distance as a function of IDT pitch simulated using FEM simulation techniques. The conductance data results from three-dimensional simulation of XBARs having a Y-cut lithium niobate piezoelectric plates. The triangle data point is for an XBAR with busbar-electrode gap distance of 2 um, IDT pitch of 3.05 um, LN plate thickness of 276 nm, and a Y-cut angles of the LN plate material for a first filter design, such as of 128 degrees. The X data point is for an XBAR with busbar-electrode gap distance of 2.5 um, IDT pitch of 4.44 um, LN plate thickness of 383 nm, and a Y-cut angles of the LN plate material are for a second filter design, such as of 157 degrees. The square data point is for an XBAR with busbar-electrode gap distance of 2.5 um, IDT pitch of 4.48 um, LN plate thickness of 360 nm, and a Y-cut angles of the LN plate material for the first filter design. The circle data points are for XBARs with busbar-electrode gap distances of between 3 and 4.5 um, IDT pitch of between 6 and 7.5 um, LN plate thickness of 562 nm, and a Y-cut angles of the LN plate material for the first filter design.

Graph 480 shows lines 481 and 482 representing where the busbar-electrode gap distance to IDT pitch (gap/pitch) ratio is ⅔ and ½, respectively. Based on the relationships of these extrapolated lines to the data points, it is desired to have an XBAR with busbar-electrode gap distance to IDT pitch ratio of less than ⅔ to avoid undesired spurs due to energy lost to spurious modes in the gaps at the ends of the IDT fingers. Thus, reducing the busbar-electrode gap distance to IDT pitch ratio to less than ⅔ is more desirable than that of greater than ⅔. In another case, reducing the busbar-electrode gap distance to IDT pitch ratio to between ⅔ and ½ is more desirable than that of outside that range.

Figure 5:
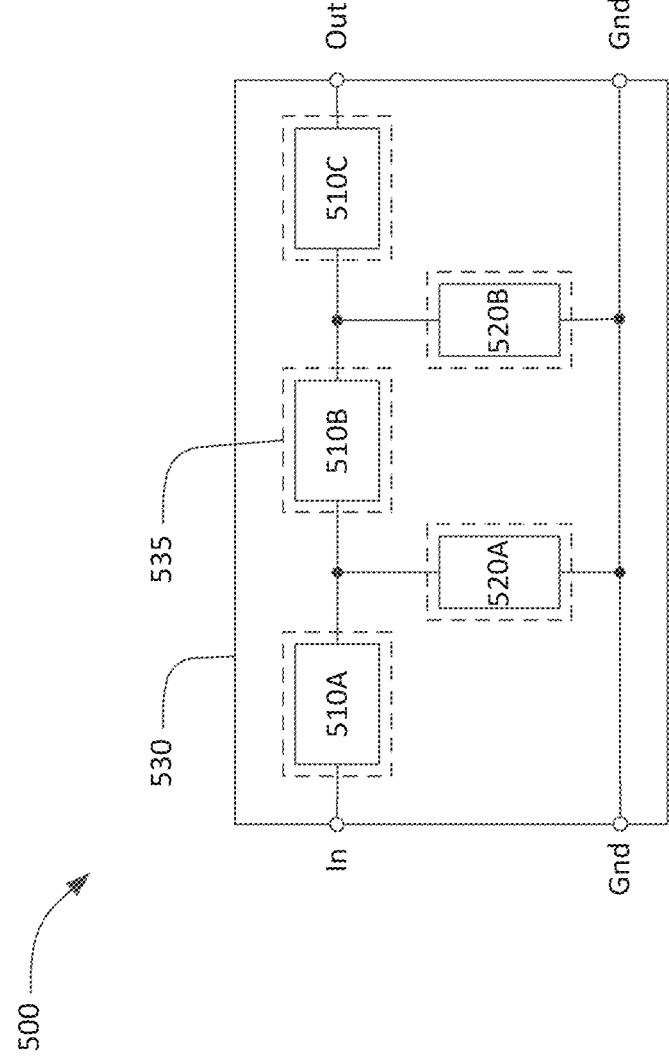
FIG. 5 is a schematic block diagram of a filter using XBARs.

FIG. 5 is a schematic circuit diagram and layout for a high frequency band-pass filter 500 using XBARs where the two connections to an XBAR that are shown are connections to the two busbars of the XBAR. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Description of Methods

Figure 6:
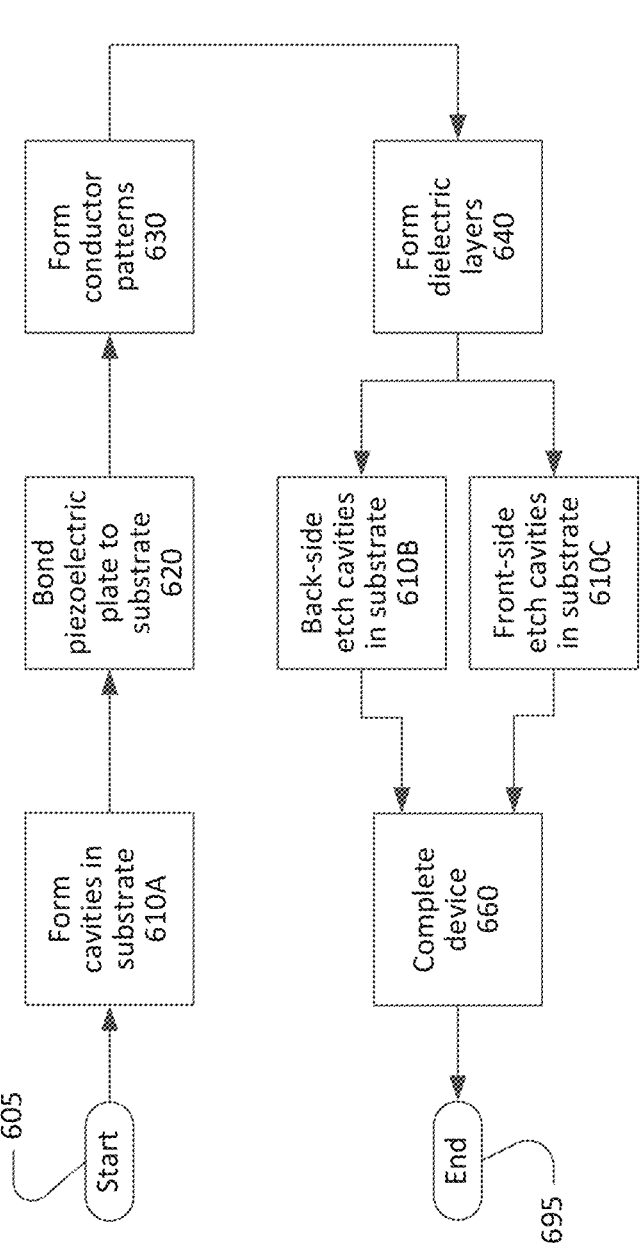
FIG. 6 is a flow chart of a conventional process for fabricating an XBAR.

FIG. 6 is a simplified flow chart showing a process 600 for making an XBAR or a filter incorporating XBARs. The process 600 starts at 605 with a substrate and a plate of piezoelectric material and ends at 695 with a completed XBAR or filter. As will be described subsequently, the piezoelectric plate may be mounted on a sacrificial substrate or may be a portion of wafer of piezoelectric material. The flow chart of FIG. 6 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6.

The flow chart of FIG. 6 captures three variations of the process 600 for making an XBAR which differ in when and how cavities are formed in the substrate. The cavities may be formed at steps 610A, 610B, or 610C. Only one of these steps is performed in each of the three variations of the process 600.

The piezoelectric plate may be, for example, Z-cut, rotated Z-cut, or rotated Y-cut lithium niobate or lithium tantalate. In some cases, it is Y-cut or rotated Y-cut lithium niobate. The piezoelectric plate may be some other material and/or some other cut. The substrate may be silicon. The substrate may be some other material that allows formation of deep cavities by etching or other processing. The silicon substrate may have layers of silicon TOX and polycrystalline silicon.

In one variation of the process 600, one or more cavities are formed in the substrate 120 or 320 at 610A, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate or layer 322, and the resulting resonator devices will have a cross-section as shown in FIG. 3A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 620, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDT's are formed prior to bonding the plate to the substrate.

Forming conductor patterns at 630 may include forming the IDT 430 having gap distance ngm on the surface of the piezoelectric plate facing away from the cavity as described for FIG. 4A. This includes forming the interleaved fingers, busbars and gap distance ngm.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate top layer 322 may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 610C will not penetrate completely through the substrate top layer 322, and the resulting resonator devices will have a cross-section as shown in FIG. 3A.

In all variations of the process 600, the filter or XBAR device is completed at 660. Actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695. FIGS. 1-4A may show examples of the fingers of selected IDTs after completion at 660.

Forming the cavities at 610A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 610B requires additional handling inherent in two-sided wafer processing. Forming the cavities from the back side also greatly complicates packaging the XBAR devices since both the front side and the back side of the device must be sealed by the package.

Forming the cavities by etching from the front side at 610C does not require two-sided wafer processing and has the advantage that the XBAR diaphragms are supported during all of the preceding process steps. However, an etching process capable of forming the cavities through openings in the piezoelectric plate will necessarily be isotropic. However, as illustrated in FIG. 3A, such an etching process using a sacrificial material allows for a controlled etching of the cavity, both laterally (i.e. parallel to the surface of the substrate) as well as normal to the surface of the substrate.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device, comprising:
   a substrate having a surface;
   a piezoelectric layer having front and back surfaces, the back surface attached to the surface of the substrate and a portion of the piezoelectric layer forming a diaphragm that is over a cavity; and
   an interdigital transducer (IDT) on the front surface of the piezoelectric layer such that interleaved fingers of the IDT are on the diaphragm;
   wherein the interleaved fingers include a first plurality of fingers extending from a first busbar of the IDT and a second plurality of fingers extending from a second busbar of the IDT,
   wherein an average center-to-center distance between all pairs of adjacent interleaved fingers defines an IDT pitch,
   wherein the IDT includes a gap distance between ends of the first plurality of fingers and the second busbar, and between ends of the second plurality of fingers and the first busbar,
   wherein the gap distance is between ⅔ and ½ times the IDT pitch,
   wherein the acoustic resonator device is a shunt resonator of a ladder filter that includes a plurality of series resonators and a plurality of shunt resonators including the acoustic resonator device, and
   wherein the IDT pitch is between 2 and 20 times a width of the interleaved fingers of the IDT.

2. The acoustic resonator device of claim 1, wherein the gap distance is between 1.0 μm and 5 μm.

3. The acoustic resonator device of claim 1, wherein the gap distance is between 1.5 μm and 5.0 μm, and the IDT pitch is between 3 μm and 7.5 μm.

4. The acoustic resonator device of claim 1, wherein a radio frequency signal applied to the IDT excites a primary shear acoustic mode in the diaphragm and a thickness of the piezoelectric layer is selected to tune the primary shear acoustic mode.

5. The acoustic resonator device of claim 4, wherein the piezoelectric layer is a Y-cut lithium niobate.

6. The acoustic resonator device of claim 4, wherein:
   the radio frequency signal applied to the IDT excites spurious modes in a gap region between the respective ends of the interleaved fingers and the adjacent busbars that cause undesired spurs in an admittance of the acoustic resonator device; and
   the gap distance is configured to suppress the spurious modes by at least 10 dB during excitation of the primary shear acoustic mode.

7. The acoustic resonator device of claim 1, wherein the gap distance of between ⅔ and ½ the IDT pitch is configured to suppress spurious modes at a band edge of a filter device including the acoustic resonator device.

8. A filter device, comprising:
   a substrate having a surface;
   a piezoelectric layer having front and back surfaces, the back surface attached to the surface of the substrate, the piezoelectric layer including portions that form a plurality of diaphragms that are over respective cavities; and
   a conductor pattern on the front surface of the piezoelectric layer, the conductor pattern comprising a plurality of interdigital transducers (IDTs) of a corresponding plurality of resonators that includes at least one shunt resonator and at least one series resonator of a ladder filter,
   wherein interleaved fingers of each IDT are on a respective diaphragm of the plurality of diaphragms,
   wherein each IDT of the plurality of IDTs comprises a first plurality of fingers extending from a first busbar of the IDT and a second plurality of fingers extending from a second busbar of the IDT,
   wherein, for each IDT of the plurality of IDTs, an average center-to-center distance between all pairs of adjacent interleaved fingers defines a respective IDT pitch,
   wherein each IDT of the plurality of IDTs includes a respective gap distance between ends of the first plurality of fingers and the second busbar, and between ends of the second plurality of fingers and the first busbar, and
   wherein, for the at least one shunt resonator of the plurality of resonators, the gap distance of the respective IDT is between ⅔ and ½ of the respective IDT pitch, and
   wherein the IDT pitch of each of the plurality of IDTs is between 2 and 20 times a width of interleaved fingers of the respective IDT.

9. The filter device of claim 8, wherein the gap distance of the IDT of the at least one shunt resonator is between 5 μm and 1.0 μm.

10. The filter device of claim 9, wherein the IDT pitch of the IDT of the at least one shunt resonator is between 3 μm and 7.5 μm.

11. The filter device of claim 8, wherein a radio frequency signal applied to the IDT of the at least one shunt resonator excites a primary shear acoustic mode in the respective diaphragm, and a thickness of the piezoelectric layer is selected to tune the primary shear acoustic mode in the diaphragm.

12. The device of claim 11, wherein:
   the piezoelectric layer is a Y-cut lithium niobate piezoelectric material;

the radio frequency signal applied to the IDT of the at least one shunt resonator excites spurious modes in a gap region between the respective ends of the interleaved fingers of the at least one shunt resonator and the respective first and second busbars that cause undesired spurs in an admittance of the at least one shunt resonator; and the gap distance is configured to suppress the spurious modes by at least 10 dB during excitation of the primary shear acoustic mode.

13. The filter device of claim 8, wherein the gap distance of the respective IDT of the at least one shunt resonator being between ⅔ and ½ the IDT pitch is configured to suppress spurious modes at a band edge of the filter device.

14. A method of fabricating an acoustic resonator device, comprising:

bonding a back surface of a piezoelectric layer to a substrate such that a portion of the piezoelectric layer forms a diaphragm spanning a cavity in the substrate; and forming an interdigital transducer (IDT) on a front surface of the piezoelectric layer such that interleaved fingers of the IDT are disposed on the diaphragm, wherein the interleaved fingers include a first plurality of fingers extending from a first busbar of the IDT and a second plurality of fingers extending from a second busbar of the IDT, wherein an average center-to-center distance between all pairs of interleaved fingers defines an IDT pitch, wherein the IDT includes a gap distance between ends of the first plurality of fingers and the second busbar, and between ends of the second plurality of fingers and the first busbar;

wherein the gap distance is between ½ and ⅓ times the IDT pitch, wherein the acoustic resonator device is a shunt resonator of a ladder filter that includes a plurality of series resonators and a plurality of shunt resonators including the acoustic resonator device, and wherein the IDT pitch is between 2 and 20 times a width of interleaved fingers of the IDT.

15. The method of claim 14, wherein the gap distance is between 1.0 μm and 5 μm.

16. The method of claim 14, wherein the gap distance is between 1.5 μm and 5.0 μm, and the IDT pitch is between 3 μm and 7.5 μm.

17. The method of claim 14, further comprising:

applying a radio frequency signal to the IDT to excite a primary shear acoustic mode in the diaphragm; and selecting a thickness of the piezoelectric layer to tune the primary shear acoustic mode in the diaphragm.

18. The method of claim 17, wherein:

the piezoelectric layer is a Y-cut lithium niobate;

the radio frequency signal applied to the IDT excites spurious modes in a gap region between the respective ends of the respective interleaved fingers and the respective first and second busbars that cause undesired spurs in an admittance of the acoustic resonator device; and the gap distance is configured to suppress the spurious modes by at least 10 dB during excitation of the primary shear acoustic mode.

19. The method of claim 14, wherein the gap distance of between ⅔ and ½ the IDT pitch is configured to suppress spurious modes at a band edge of a filter device including the acoustic resonator device.

* * * * *